United States Patent
Makinson et al.

(10) Patent No.: US 9,885,743 B2
(45) Date of Patent: Feb. 6, 2018

(54) ELECTRIC METER BASE LEVEL PRINTED CIRCUIT BOARD

(71) Applicant: Itron, Inc., Liberty Lake, WA (US)

(72) Inventors: David Nelson Makinson, Seneca, SC (US); Joseph Pontin, Seneca, SC (US)

(73) Assignee: Itron, Inc., Liberty Lake, WA (US)

( * ) Notice: Subject to any disclaimer, the term of this patent is extended or adjusted under 35 U.S.C. 154(b) by 808 days.

(21) Appl. No.: 13/717,456

(22) Filed: Dec. 17, 2012

(65) Prior Publication Data

US 2014/0167738 A1  Jun. 19, 2014

(51) Int. Cl.
*G01R 22/06* (2006.01)
*H05K 1/02* (2006.01)
*G01R 11/02* (2006.01)

(52) U.S. Cl.
CPC ......... *G01R 22/061* (2013.01); *H05K 1/0263* (2013.01); *G01R 11/02* (2013.01); *H05K 1/0268* (2013.01); *H05K 2201/1003* (2013.01); *H05K 2201/10151* (2013.01); *H05K 2201/10189* (2013.01); *H05K 2201/10356* (2013.01); *H05K 2201/10454* (2013.01)

(58) Field of Classification Search
CPC ............... H05K 1/0263; H05K 1/0265; H05K 2201/1003; H05K 2201/10151; H05K 2201/10189; H05K 2201/10356; H05K 2201/10454; H01K 1/0268
See application file for complete search history.

(56) References Cited

U.S. PATENT DOCUMENTS

| | | | |
|---|---|---|---|
| 2,154,411 A | * | 4/1939 | Road ............... G01R 11/02 361/670 |
| 4,467,434 A | | 8/1984 | Hurley et al. |
| 4,804,957 A | | 2/1989 | Selph et al. |

(Continued)

FOREIGN PATENT DOCUMENTS

| | | |
|---|---|---|
| EP | 0803732 | 10/1997 |
| EP | 1515146 | 3/2005 |

(Continued)

OTHER PUBLICATIONS

PCT Search Report dated Jan. 8, 2014 for PCT Application No. PCT/US13/62759, 9 pages.

*Primary Examiner* — Son Le
*Assistant Examiner* — Dustin Dickinson
(74) *Attorney, Agent, or Firm* — Lee & Hayes, PLLC

(57) ABSTRACT

Techniques for construction of an electric meter base level printed circuit board (PCB), such as for use in an electric consumption meter, are described herein. A plurality of heavy copper traces may be embedded in the PCB, thereby eliminating the need for heavy copper bar between connectors and components on the board. In one example, a PCB includes connectors for incoming and outgoing line and neutral conductors. The PCB may include a current measuring component, mounted on the PCB, to communicate with metrology circuitry. The PCB may include one or more switches, configured to regulate electrical service. Heavy electrical traces may be embedded in the PCB to connect the connectors and various components mounted on the PCB. The heavy electrical traces are sized to allow passage of currents that may be in excess of 100 amps.

17 Claims, 4 Drawing Sheets

(56) References Cited

U.S. PATENT DOCUMENTS

| | | | | |
|---|---|---|---|---|
| 5,471,089 | A * | 11/1995 | Nagatomo | H01L 23/50 257/691 |
| 5,786,974 | A * | 7/1998 | Zaretsky | 361/107 |
| 7,586,718 | B1 * | 9/2009 | Radosavljevic | H01H 83/04 361/42 |
| 8,469,724 | B1 * | 6/2013 | Barnette | H01R 12/7088 439/86 |
| 2002/0084914 | A1 * | 7/2002 | Jackson et al. | 340/870.02 |
| 2004/0150384 | A1 * | 8/2004 | Holle et al. | 324/110 |
| 2004/0222782 | A1 * | 11/2004 | Tate | G01R 11/067 324/142 |
| 2004/0254750 | A1 * | 12/2004 | MacFarlene et al. | 702/61 |
| 2005/0270016 | A1 | 12/2005 | Karanam et al. | |
| 2007/0007944 | A1 * | 1/2007 | Burns | G01R 22/065 324/142 |
| 2007/0206062 | A1 * | 9/2007 | Malpica | B41J 2/14072 347/58 |
| 2008/0024115 | A1 * | 1/2008 | Makinson et al. | 324/142 |
| 2009/0294260 | A1 | 12/2009 | Makinson et al. | |
| 2010/0071947 | A1 * | 3/2010 | Nakai | H05K 1/181 174/260 |
| 2011/0168435 | A1 * | 7/2011 | Barry | H05K 1/0265 174/257 |
| 2012/0200303 | A1 * | 8/2012 | Guo | G01R 31/3004 324/613 |
| 2012/0229998 | A1 * | 9/2012 | Kagaya | H01P 1/02 361/777 |
| 2013/0069617 | A1 * | 3/2013 | Lee | 323/318 |

FOREIGN PATENT DOCUMENTS

| | | |
|---|---|---|
| EP | 2488003 | 8/2012 |
| WO | WO0033090 | 6/2000 |

* cited by examiner

ELECTRIC METER BASE LEVEL PRINTED CIRCUIT BOARD

BACKGROUND

An electricity consumption-measuring meter (e.g., as provided at customer sites by a utility company) may include a base level printed circuit board (PCB). The base level PCB may include connectors for receiving incoming electricity service from the utility and providing outgoing electricity service to conductor wiring at a site. The base level PCB may include one or more current measuring components and one or more current regulating switches (e.g., to regulate electrical service). The connectors, current measuring component(s) and switch(es) are typically interconnected by use of heavy copper bar. The bar provides the connectivity required of heavy current flow (e.g., over 100 amps in the typical residential meter). However, the bar is costly and requires assembly to the PCB, and changes to the PCB often require changes to the tooling used to manufacture the copper bar.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components. Moreover, the figures are intended to illustrate general concepts, and not to indicate required and/or necessary elements.

DETAILED DESCRIPTION

Overview

An electric meter base level printed circuit board (PCB), such as for use in an electric consumption meter, is described herein. The base level PCB receives incoming and outgoing power/neutral conductors, and routes the current through current measuring component(s) and (optionally) switch(es). In example designs described herein, substantial current—e.g., over 100 amps of current at 120 volts alternating current (VAC)—may be carried through conducting traces embedded in or between layers of the PCB. The circuit board traces or conductors may be heavy copper or other electrically conducting metal or alloy, and several traces (perhaps located on different PCB layers) may act in electrical parallel to distribute current and reduce electrical resistance. In one example, a plurality of heavy copper traces may be embedded in the PCB, to carry current to and from a plurality of connectors and components on the PCB. In one example, a PCB includes connectors for incoming and outgoing line and neutral conductors. The PCB may include a current measuring component, mounted on the PCB. The current measuring component—e.g., a current coil or shunt—may extend to a point adjacent to a sensor, which may be located on a different PCB having appropriate metrology circuitry. The PCB may include one or more switches, configured to regulate electrical service. Heavy electrical traces may be embedded in the PCB to connect the connectors and various components mounted on the PCB. The heavy electrical traces may be sized to allow passage of electricity service currents that may be 80 amps or more.

The discussion herein includes several sections. Each section is intended to be an example of techniques and/or structures, but is not intended to indicate elements which must be used and/or performed. A section entitled "Electric Meter Base Level Printed Circuit Board (PCB)" describes a 6-connector version of the base level PCB. A section entitled "Example 4-Connector Base Level PCB" describes an alternative 4-connector version of the PCB. The discussion ends with a brief conclusion. This brief introduction is provided for the reader's convenience and is not intended to describe and/or limit the scope of the claims or any section of this disclosure.

Electric Meter Base Level Printed Circuit Board (PCB)

Figure 1:
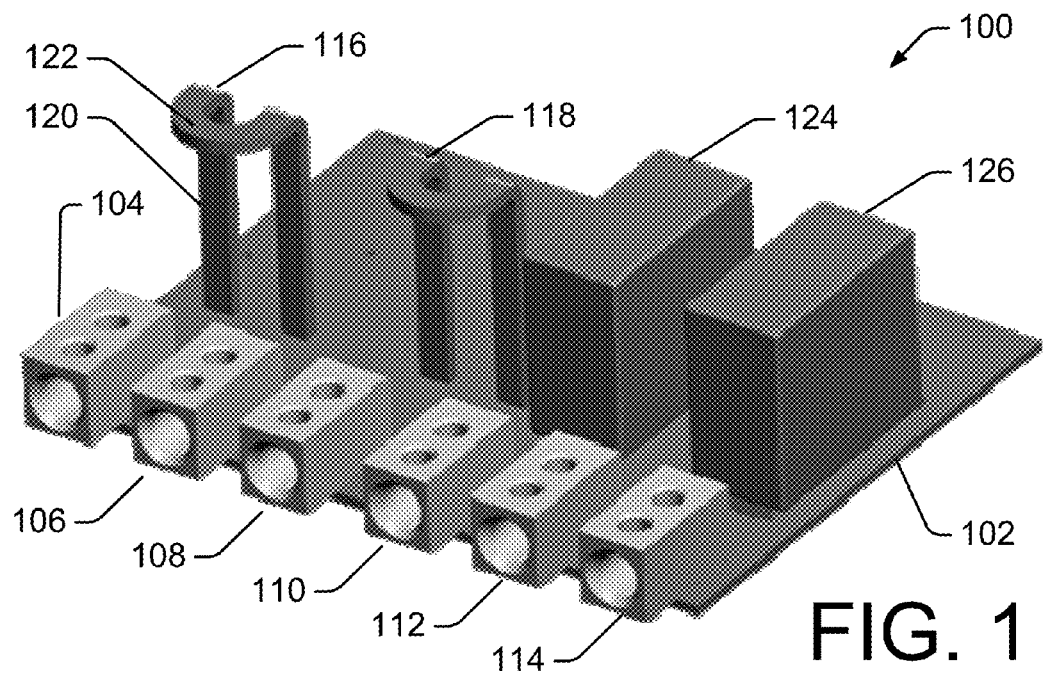
FIG. 1 is a perspective view of an example electric meter base level PCB. Six connectors for incoming and outgoing conductors, two current coils and two switches are shown, two or more of which are electrically connected via a current carrying trace of the PCB.

FIG. 1 is a perspective view of an example electric meter base level PCB 100 for use in an electric meter. The base level PCB 100 may include one or more current measuring components, which may be positioned near metrology circuitry in an adjacent PCB. Also, the base level PCB 100 may include one or more switches, which may be used to turn a customer's electric service on or off. The base level PCB 100 may include connectors for attachment to incoming and outgoing conductors (e.g., wires). In the 6-conductor version shown, three incoming and three outgoing connectors are shown, associated with two "hot" or "line voltages" (e.g., +/−120 VAC) and neutral. Thus, in operation, current enters the base level PCB 100 through three connectors, is routed through current measuring component(s) and switch(es), and exits the base level PCB through three different connectors. The current may pass through the current measuring component and then through the switch, in the reverse order.

FIG. 1 shows an example base level PCB 100 having a multilayer PCB 102. In the example shown, six connectors 104-114 are mounted on the board, and configured to attach to incoming and outgoing conductors (e.g., wires) carrying current. For example, connector 104 may connect to an incoming conductor with +120 VAC; connector 106 may connect to an incoming conductor with −120 VAC; connector 108 may connect to an incoming neutral (return) conductor; connector 110 may connect to an outgoing neutral conductor; connector 112 may connect to an outgoing conductor with −120 VAC; and connector 114 may connect to an outgoing conductor with +120 VAC. Note that +120 VAC and −120 VAC are different 120 VAC phases.

In the example shown, the incoming +/−120 VAC of connectors 104, 106 may be electrically connected to current measuring components 116, 118, respectively. In the example shown, the current measuring components are current coils having a half-turn winding. Such coils may be used in combination with a Hall effect sensor in metrology circuitry. Alternatively, other current measuring components and/or technologies may be used, such as a shunt (e.g., in combination with voltage measurement circuitry in metrology circuitry), a current transformer or a mutual inductance coil, etc.

The current coils 116, 118 may include a riser portion 120, which elevates a coil portion 122 a preferred distance above the PCB 102. In particular, the riser portion 120 may position the coil portion 122 to a location adjacent to a sensor (e.g., a Hall effect sensor), which may be located on an adjacent motherboard. Thus, the field associated with the half-turn coil 122 is measurable by the sensor on the adjacent PCB. By locating the current measuring components 116, 118 on the PCB 100, they are not located on the PCB on which the sensor is located.

Current leaving the current measuring components 116, 118 may pass to switches 124, 126, respectively. The switches 124, 126 may or may not be present, depending on if service disconnection functionality is desired. The current measuring components and switches may be oriented in reverse order, with respect to current flow. The output of the switches 124, 126 (or the current measuring components 116, 118 if no switches are present) may be connected to the connectors 112, 114. The connectors 108, 110, associated with incoming and outgoing neutral conductors, may be shorted together to provide electrical continuity.

Figure 2:
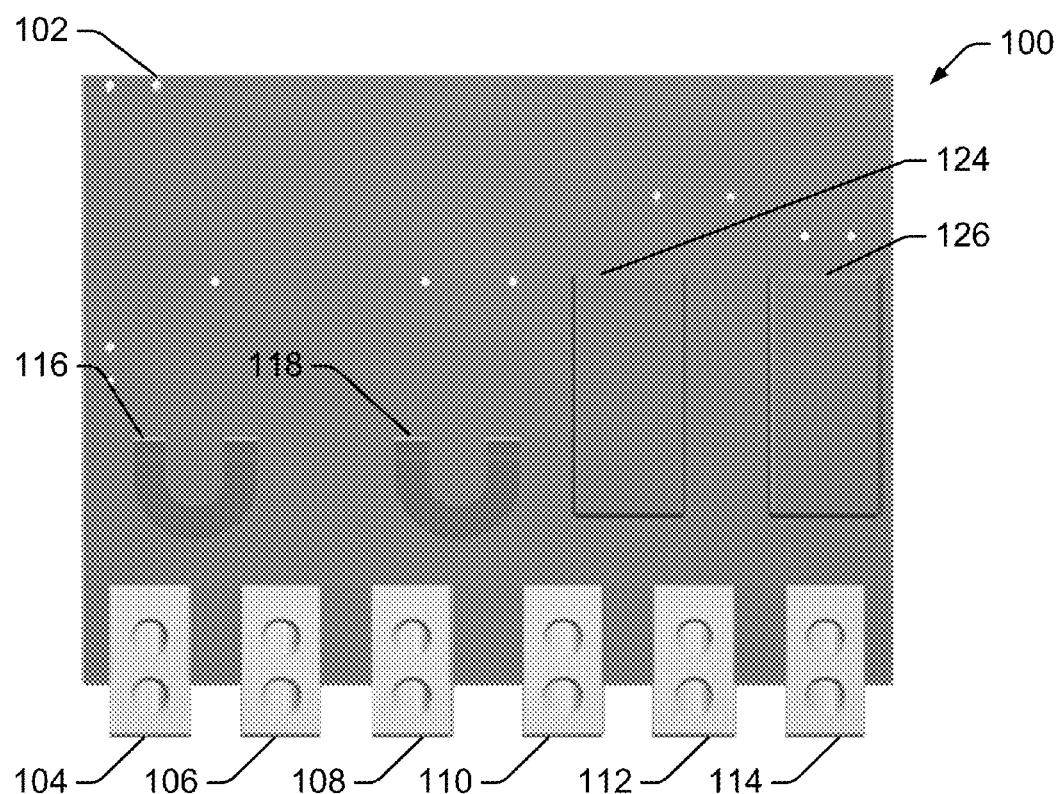
FIG. 2 is an orthographic plan view of the example electric meter base level PCB of FIG. 1.

FIG. 2 is an orthographic plan view of the example electric meter base level PCB 100 of FIG. 1.

Figure 3:
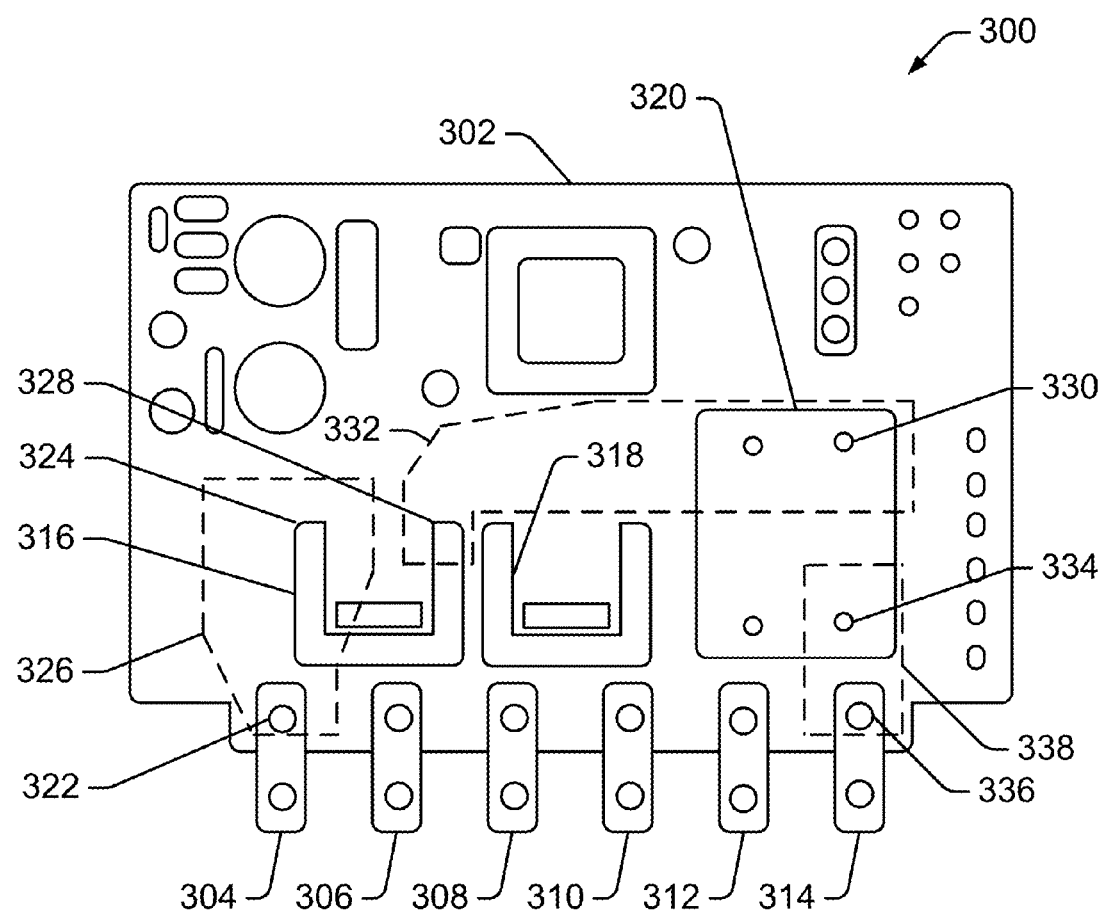
FIG. 3 is an orthographic view of a further example electric meter base level PCB, having six connectors. Three high-power conducting traces are shown in dotted outline, connecting an incoming voltage connector to the current coil, the current coil to a switch, and the switch to an outgoing voltage connector.

FIG. 3 is an orthographic view of a further example of a base level PCB 300 for an electric meter. The base level PCB 300 may include a multilayer PCB 302, on which a number of components (e.g., power supply, capacitors, etc., not labeled) may be mounted. A number of connectors 304-314 are substantially as seen in FIGS. 1 and 2. Two current measuring components 316, 318 (e.g., current coils) and a dual (e.g., double-pole/double-throw) switch 320 are shown.

A terminal 322 of connector 304 may be electrically connected to a terminal 324 of current measuring component 316. The electrical connection may be made by a copper trace 326 embedded in, located on, or disposed between layers of the PCB 302.

The copper traces used in any embodiment discussed herein may be somewhat "block-shaped" (e.g., traces may be "wide," "planar" or have "spread") to provide a larger surface area than is present in conventional thin and wire-like traces. The larger surface area conducts electrical current with less electrical resistance and heat production than a trace of smaller dimensions. The traces may be any dimensions, but traces that are about 11 mm wide, in multiple layers of 210 microns thickness are capable of safely conducting 100 amps or more. The width (e.g., "block shape"), thickness of the trace and the number of layers are all important indicators of current carrying capacity. In one example, the conducting traces are between 13 mm and 20 mm wide. The thickness of the traces may include 1-, 3- or 6-ounce weights (in industry terminology). A 1-ounce copper trace may be approximately 33 microns of copper thickness. Additionally or alternatively, the conducting traces may not be of equal length, and shorter traces may have less average width than longer traces. Moreover, any of the traces discussed herein may be configured together with one or more parallel traces (which may be on a same or different layer of the PCB) to further reduce electrical resistance. The parallel traces may have the same or different size, shape and/or thickness. However, the parallel trace(s) will conduct current to and from the same circuit locations. Additionally or alternatively, plated through holes in communication with one or more traces may be used to conduct heat away from the trace, and to the surface of the PCB. The plated through holes may provide a means for conductive heat transfer out of the copper trace(s) and into the atmosphere.

Two or more electrically conducting circuit board traces may be located in the same or different layers of the PCB 302, to transmit current electrically in parallel from a same first location and to a same second location. For example, the conducting trace 326 may be located in one layer of PCB 302, and a second trace may be located in a second or different layer of the PCB 302. Both traces may conduct electricity from the terminal 322 of the connector 304 to the terminal 324 of current measuring component 316. Thus, the conducting traces within the PCB may be arranged so that a first embedded conducting trace is located on a first layer of the PCB, and is located to carry current from a connector (or other component) and to the current measuring device (or other component). Additionally, a second (and optionally third, etc.) embedded conducting trace on a second or different layer of the PCB, may be arranged to carry current between the same two points. Thus, the first and second embedded conducting traces are electrically in parallel and conduct current between a same two locations and/or components or devices. In a further example, traces that cross may initiate and terminate to a different set of end points. This makes use of the inherent dielectric of the PCB to isolate opposing phases that would seem to occupy the same space (if viewed in plan view or from an orthographic perspective).

A terminal 328 of the current measuring component 316 and a terminal 330 of a switch 320 may be electrically connected by a trace 332. Similarly, a terminal 334 of the switch 320 and a terminal 336 of the connector 314 may be electrically connected by a trace 338.

Example 4-Connector Base Level PCB

Figure 4:
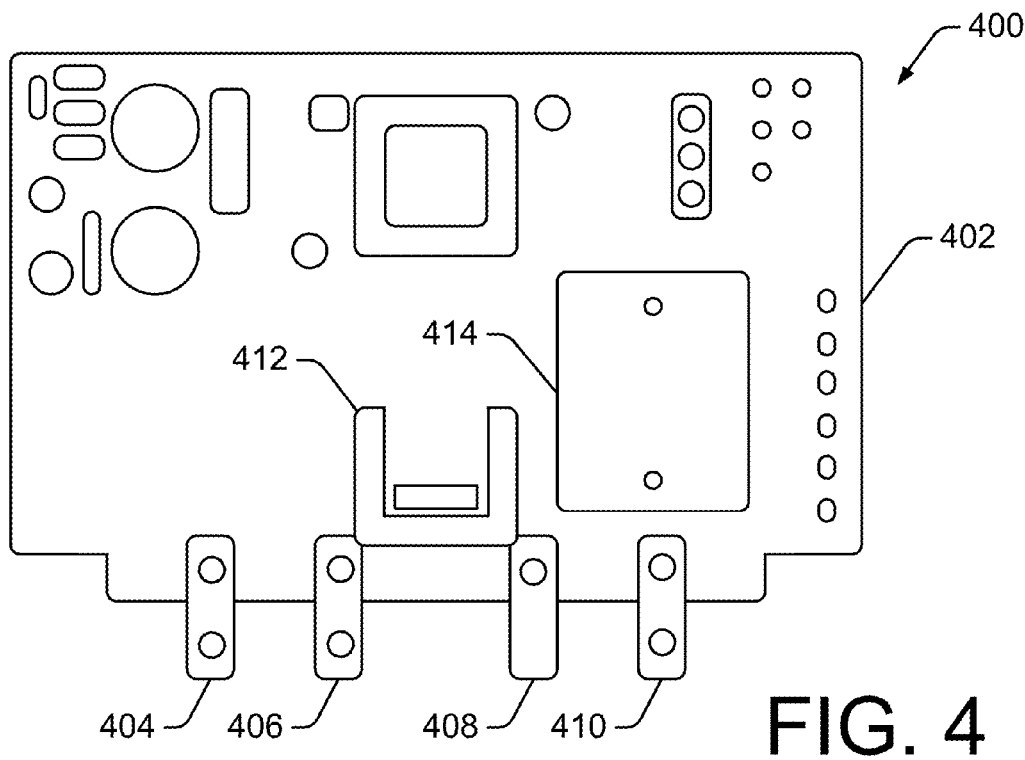
FIG. 4 is an orthographic view of a further example of an electric meter base level PCB having four connectors.

FIG. 4 is an orthographic view of a further example of an electric meter base level PCB 400 having four connectors. A PCB 402 may include multiple layers and may contain a number of high-current carrying PCB traces. A connector 404 is configured to attach to an incoming line voltage conductor, and a connector 410 is configured to attach to the outgoing line voltage conductor. A connector 406 is configured to attach to an incoming neutral conductor, and a connector 408 is configured to attach to an outgoing neutral conductor. A current measuring component, current coil 412 is configured for attachment to the incoming voltage connector 404 and switch 414. Switch 414 may also be connected to connector 410.

Figure 5:
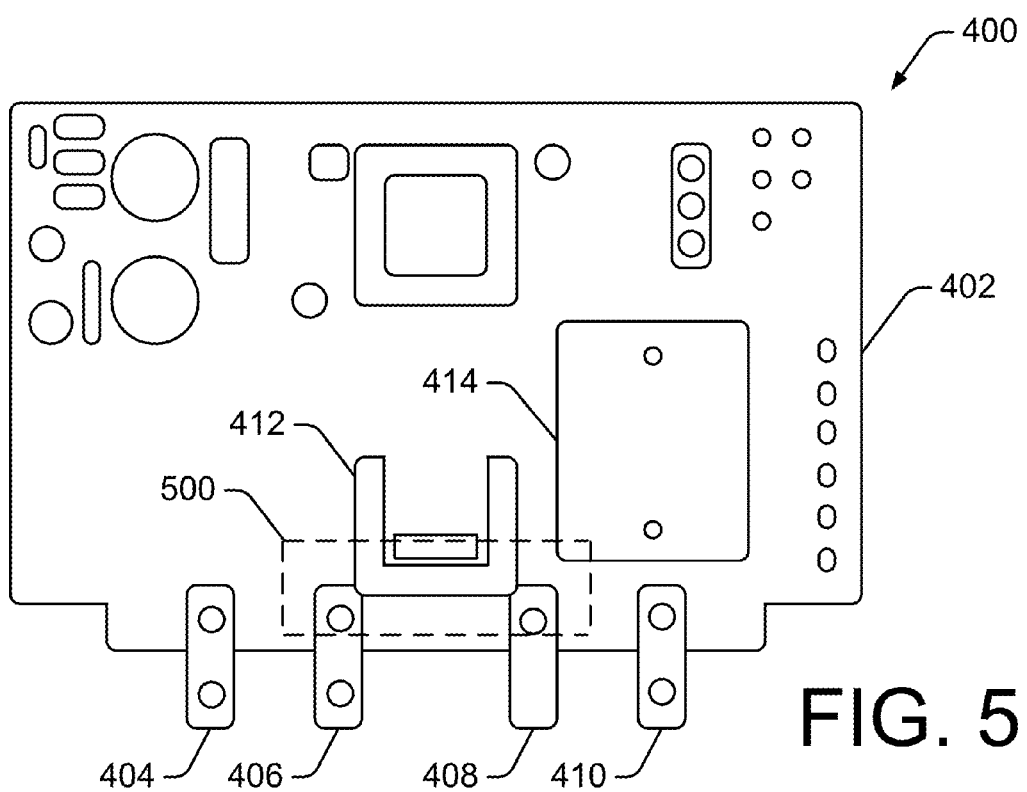
FIG. 5 is an orthographic view of the example electric meter base level PCB of FIG. 4, showing in dotted outline a PCB trace connecting the incoming and outgoing neutral connectors.

FIG. 5 is an orthographic view of the example electric meter base level PCB of FIG. 4, showing in dotted outline a PCB trace 500 connecting the incoming and outgoing neutral connectors 406, 408, respectively. The trace 500 may be substantially block shaped to provide for less electrical resistance than a narrow linear trace. The trace 500 may be part of a plurality of electrically parallel traces distributed on one or more layers of PCB 402. The parallel traces may have the same or different size, shape and/or thickness.

Figure 6:
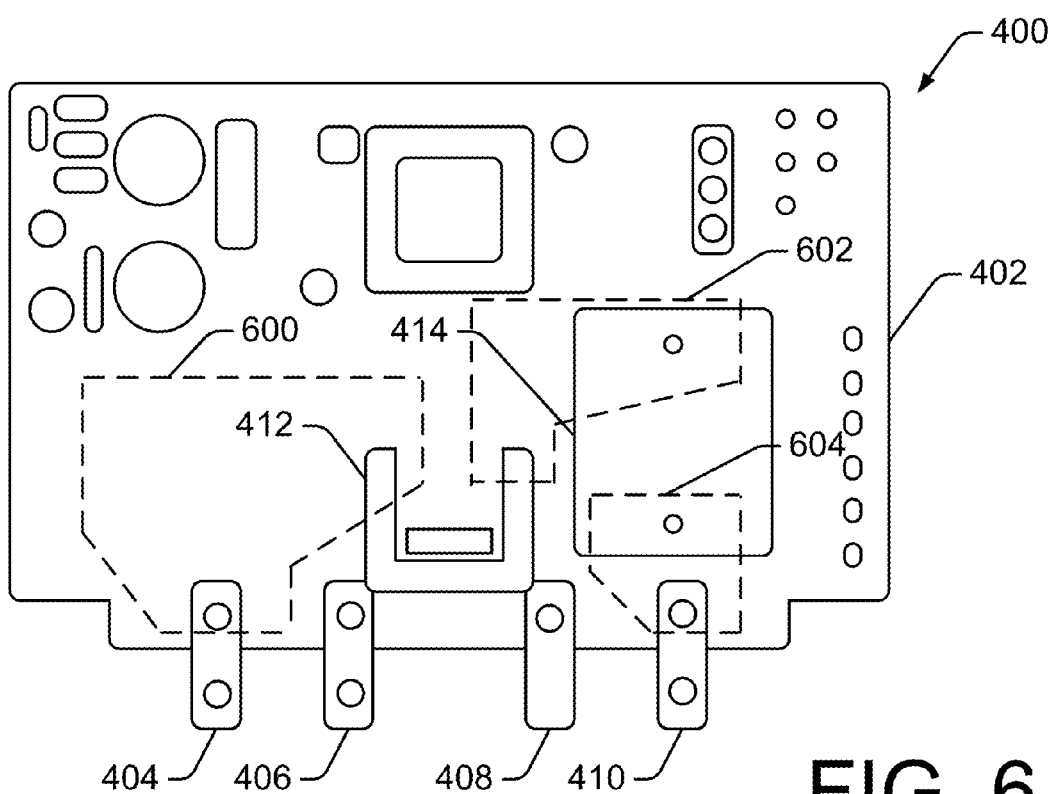
FIG. 6 is an orthographic view of the example electric meter base level PCB of FIG. 4, showing in dotted outline three printed circuit conducting traces, connecting an incoming voltage connector to the current coil, the current coil to a switch, and the switch to an outgoing voltage connector.

FIG. 6 is an orthographic view of the example electric meter base level PCB of FIG. 4, showing in dotted outline three printed circuit conducting traces. A first trace 600 connects an incoming voltage connector 404 to the current coil 412. A second trace 602 connects the current coil 412 to a switch 414. A third trace 604 connects the switch 414 to an outgoing voltage connector 410.

Figure 7:
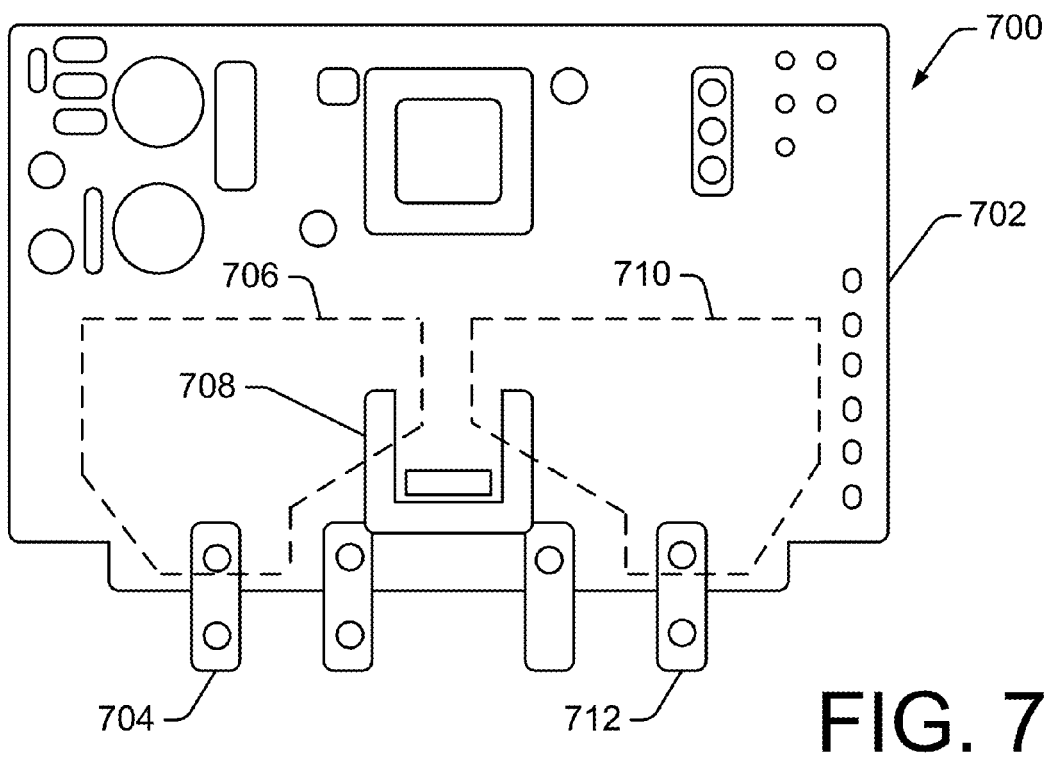
FIG. 7 is an orthographic view of the example electric meter base level PCB having no switch, showing in dotted outline two printed circuit conducting traces, each connecting a connector to the current coil.

FIG. 7 is an orthographic view of the example electric meter base level PCB 700 having a multilayer PCB 702 and no switch. Two printed circuit conducting traces are shown in dotted outline. In the example shown, a connector 704 is configured for attachment to an incoming line voltage conductor. A copper trace 706 provides electrical connectivity to a current coil 708. A second copper trace 710 provides electrical connectivity from the current coil 708 to a connector 712 connectable to an outgoing line voltage conductor.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. An electric consumption meter, comprising:
   a printed circuit board (PCB);
   connectors, attachable to incoming power and neutral conductors that connects to an electric utility provider, mounted on the PCB;
   connectors, attachable to outgoing power and neutral conductors that connects to an electricity customer, mounted on the PCB;
   a current measuring component, mounted on the PCB, to communicate with metrology circuitry to measure current, the current measuring component comprising a riser and a coil, the riser having a height such that the riser supports the coil spaced a distance from the PCB;
   a first current conducting trace defined within the PCB and forming at least part of a path between the connector attached to the incoming power conductor and the connector attached to the outgoing power conductor; and
   a second current conducting trace, electrically in parallel with the first current conducting trace, defined within the PCB, wherein the first current conducting trace and the second current conducting trace are sized and shaped to jointly conduct at least 80 amps, wherein the first and second current conducting traces pass an electricity service current within the PCB that also passes through the coil at the distance spaced from the PCB determined by the riser.

2. The electric consumption meter of claim 1, wherein the current measuring component comprises a current coil, and the metrology circuitry includes a Hall effect sensor.

3. The electric consumption meter of claim 1, wherein the first current conducting trace and the second current conducting trace are on two different circuit board layers.

4. The electric consumption meter of claim 1, wherein the first current conducting trace and the second current conducting trace connect a same two circuit points.

5. The electric consumption meter of claim 1, wherein a switch is connected to the first current conducting trace.

6. The electric consumption meter of claim 1, wherein the first current conducting trace is substantially block shaped.

7. The electric consumption meter of claim 1, wherein the first current conducting trace comprises plated through holes to provide a heat-conducting pathway to a surface of the PCB.

8. A meter base level printed circuit board (PCB), comprising:
   a PCB;
   an incoming power connector, attachable to an incoming power conductor that connects to an electric utility provider, mounted on the PCB;
   an outgoing power connector, attachable to an outgoing power conductor that connects to an electricity customer, mounted on the PCB;
   a switch configured to regulate an electrical service of a customer;
   a current measuring component, mounted on the PCB, to communicate with metrology circuitry to measure current, wherein a riser of the current measuring component supports a coil of the current measuring component, the riser having a height such that the riser supports the coil spaced a distance from the PCB; and
   a plurality of layers of conducting traces in the PCB, wherein the plurality of conducting traces connect the incoming power connector, the outgoing power connector, the switch and the current measuring component, and wherein the plurality of layers comprise:
      a first current conducting trace on a first layer of the PCB;
      a second current conducting trace on a second layer of the PCB, electrically in parallel with the first current conducting trace, wherein the first current conducting trace and the second current conducting trace are sized and shaped to jointly conduct at least 80 amps, wherein the first and second current conducting traces pass an electricity service current that also passes through the current measuring component, and wherein a distance between the electricity service current in the PCB and the coil is determined by the riser.

9. The meter base level PCB of claim 8, wherein each of the plurality of layers of conducting traces is made of copper.

10. The meter base level PCB of claim 8, wherein:
    parallel traces lead to the current measuring component and are distributed among at least two layers of the PCB;
    parallel traces lead from the current measuring component and are distributed among at least two layers of the PCB.

11. The meter base level PCB of claim 8, wherein:
    the first and second conducting traces are substantially block shaped; and
    plated through holes provide a conducting pathway from the first and second conducting traces to a surface of the PCB.

12. The meter base level PCB of claim 8, wherein:
    the one or more conducting traces are between 13 mm and 20 mm wide; and
    the one or more conducting traces are made substantially of copper.

13. The meter base level PCB of claim 8, wherein the current measuring component comprises a current coil.

14. A meter base level printed circuit board (PCB), comprising:
    a PCB;
    an incoming power connector, attachable to an incoming power conductor, mounted on the PCB;

an outgoing power connector, attachable to an outgoing power conductor, mounted on the PCB;

an incoming neutral connector, attachable to an incoming power conductor, mounted on the PCB;

an outgoing neutral connector, attachable to an outgoing power conductor, mounted on the PCB;

a switch, mounted on the PCB, configured to regulate an electrical service of a customer;

a current measuring component, mounted on the PCB, to communicate with metrology circuitry to measure current, wherein a riser of the current measuring component supports a coil of the current measuring component; and a plurality of conducting traces in or on the PCB, wherein:
   a first current conducting trace from among the plurality of conducting traces is on a first layer of the PCB;
   a second current conducting trace from among the plurality of conducting traces is on a second layer of the PCB and is electrically in parallel with the first current conducting trace, wherein the first current conducting trace and the second current conducting trace are sized and shaped to jointly conduct at least 80 amps, and wherein a distance between an electricity service current in the PCB and the coil is determined by the riser.

15. The meter base level PCB of claim 14, wherein the plurality of conducting traces are copper traces and are distributed among a plurality of layers on the PCB.

16. The meter base level PCB of claim 14, wherein the plurality of conducting traces are sized to conduct at least 80 amps.

17. The meter base level PCB of claim 14, wherein the plurality of conducting traces comprise parallel traces on different layers of the meter base level PCB and connect a same two circuit points.

* * * * *